(12) United States Patent
Voerckel

(10) Patent No.: US 8,003,490 B2
(45) Date of Patent: Aug. 23, 2011

(54) INTEGRATED CIRCUIT AND METHOD INCLUDING AN ISOLATION ARRANGEMENT

(75) Inventor: Andreas Voerckel, Dresden (DE)

(73) Assignee: Qimonda AG, Munich (DE)

( * ) Notice: Subject to any disclaimer, the term of this patent is extended or adjusted under 35 U.S.C. 154(b) by 647 days.

(21) Appl. No.: 12/035,032

(22) Filed: Feb. 21, 2008

(65) Prior Publication Data
US 2008/0197444 A1     Aug. 21, 2008

(30) Foreign Application Priority Data
Feb. 21, 2007  (DE) .......................... 10 2007 008 530

(51) Int. Cl.
*H01L 21/76*    (2006.01)
(52) U.S. Cl. ................. 438/435; 257/510; 257/E21.546
(58) Field of Classification Search ............... 257/510, 257/E21.546; 438/435
See application file for complete search history.

(56) References Cited

U.S. PATENT DOCUMENTS

| 2002/0072198 A1* | 6/2002 | Ahn .............................. 438/424 |
| 2004/0072408 A1* | 4/2004 | Yun et al. ..................... 438/435 |
| 2005/0003630 A1* | 1/2005 | Ji et al. .......................... 438/435 |
| 2005/0009293 A1* | 1/2005 | Kim et al. ..................... 438/424 |
| 2005/0110074 A1* | 5/2005 | Jang et al. .................... 257/327 |
| 2005/0127472 A1* | 6/2005 | Yun et al. ..................... 257/506 |
| 2005/0287731 A1  | 12/2005 | Bian et al. |
| 2006/0024912 A1* | 2/2006 | Lee .............................. 438/424 |
| 2006/0205173 A1* | 9/2006 | Song et al. .................... 438/424 |
| 2006/0246657 A1  | 11/2006 | Kim et al. |
| 2008/0121977 A1* | 5/2008 | Choi et al. ................... 257/321 |
| 2009/0004817 A1* | 1/2009 | Kim et al. .................... 438/435 |
| 2009/0068817 A1* | 3/2009 | Eun .............................. 438/425 |

* cited by examiner

*Primary Examiner* — Allan R Wilson

(74) *Attorney, Agent, or Firm* — Dickie, Billig & Czaja, PLLC

(57) ABSTRACT

An integrated circuit and method including an isolation arrangement. One embodiment provides a substrate having trenches and mesa regions and also auxiliary structures on the mesa regions. A first isolation structure covers side walls and a bottom region of the trenches and at least partially side walls of the auxiliary structure. A liner on the first isolation structure fills the trenches and gaps between the auxiliary structures with a second isolation structure; and the second isolation structure is pulled back, wherein upper sections of the liner are uncovered.

14 Claims, 22 Drawing Sheets

INTEGRATED CIRCUIT AND METHOD INCLUDING AN ISOLATION ARRANGEMENT

CROSS-REFERENCE TO RELATED APPLICATIONS

This Utility Patent Application claims priority to German Patent Application No. DE 10 2007 008 530.5 filed on Feb. 21, 2007, which is incorporated herein by reference.

BACKGROUND

In the development of integrated semiconductor circuits the miniaturization of component dimensions represents an important development, in order to increase the number of integrated circuits on a semiconductor wafer and thus to reduce the production costs per integrated circuit. By way of example, a reduction of an exposure wavelength of the photolithography integrated into the process sequence makes it possible to shrink a minimum feature size such as e.g., a gate length or a width of interconnects. Consequently, the dimensions of an individual memory cell in a memory cell array can be reduced, which is linked with an increase in the memory density and a decrease in the production costs per memory bit.

With increasing structure miniaturization, stringent requirements are made of isolation arrangements such as e.g., STI (Shallow Trench Isolation) and spacers, since the isolation arrangements become thinner and thinner upon structure miniaturization and are nevertheless intended to ensure electrical isolation between semiconductor regions at different potentials.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 2A to 2I illustrate schematic cross-sectional views of a substrate excerpt during various process stages for producing an isolation arrangement for a nonvolatile memory device in accordance with one embodiment.

DETAILED DESCRIPTION

Figure 1A:
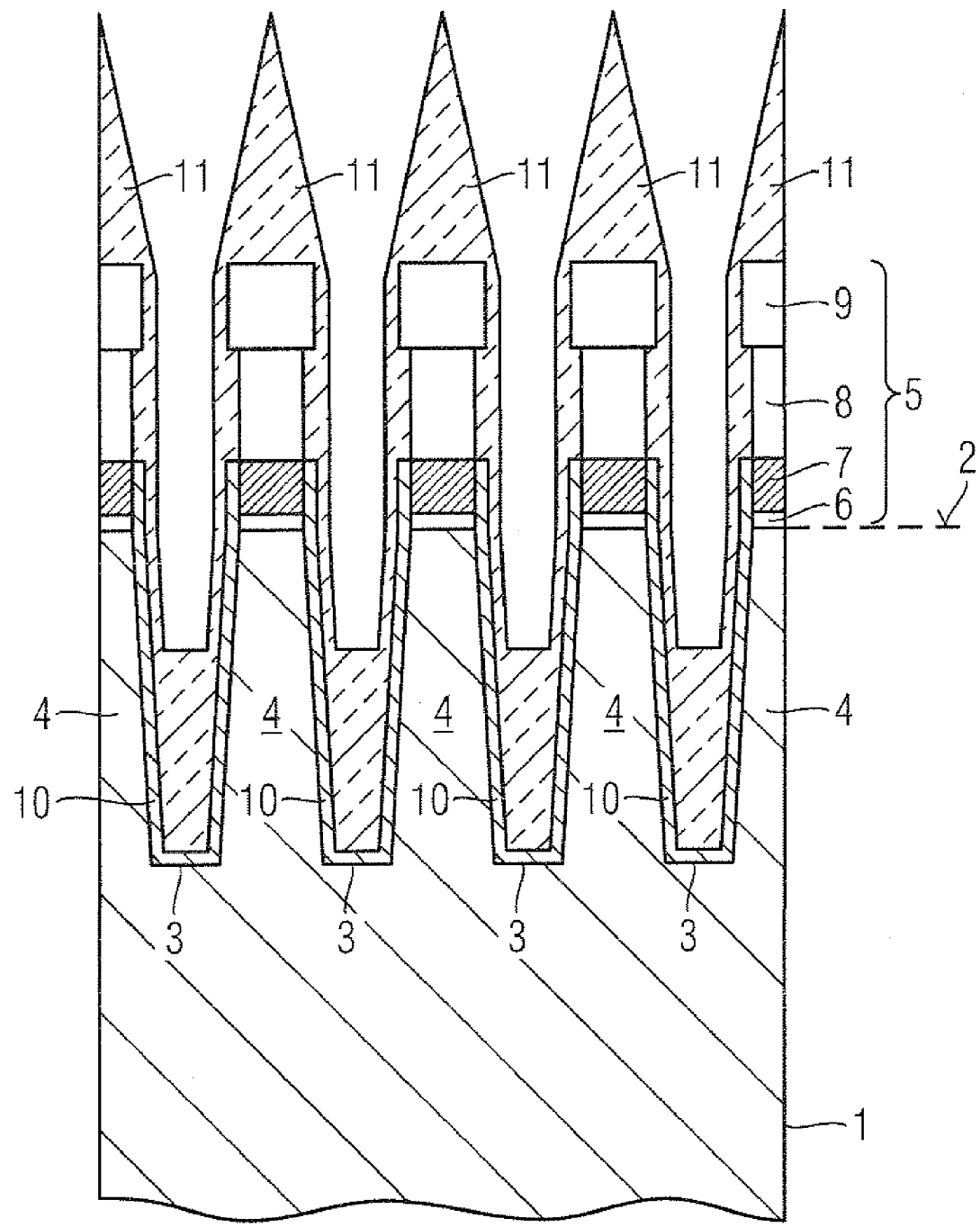
FIGS. 1A to 1K illustrate schematic cross-sectional views of a substrate excerpt during various process stages for forming an isolation arrangement for a nonvolatile memory device in accordance with one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The following description relates to an integrated circuit including an isolation arrangement, and to a method for producing the same.

One embodiment provides a method for producing an integrated circuit including an isolation arrangement by providing a substrate having trenches and mesa regions and auxiliary structures on the mesa regions. This is followed by providing a first isolation structure, which covers side walls and a bottom region of the trenches and at least partially side walls of the auxiliary structures. The method additionally includes providing a liner on the first isolation structure and also filling the trenches and gaps between the auxiliary structures with a second isolation structure, after which the second isolation structure is pulled back and upper sections of the liner are uncovered.

The substrate can be formed for example as a semiconductor substrate in the form of a silicon wafer. The substrate can likewise be preprocessed in any desired manner. In this connection it is possible for instance to form semiconductor zones within the mesa regions. The trenches extend from a surface into the substrate and can be dimensioned in a suitable manner in order to form a trench isolation such as STI therein. The mesa regions can run in strip form and be separated from one another by trenches likewise running in strip form. The first isolation structure can extend for instance from the side walls within the trenches along the side walls of the auxiliary structure. A height level as far as which the side walls of the auxiliary structure are covered by the first isolation structure can be defined by the first isolation structure initially completely covering the auxiliary structure and thereupon being pulled back as far as the desired height level, e.g., with the aid of a sacrificial filling that fills the trenches and a gap between the auxiliary structures as far as the desired height level.

The auxiliary structure can include a plurality of layers, for example, which can differ with regard to their material composition. Some or all of the layers of the auxiliary structure can be removed again in later processes.

The liner covers the first isolation structure in the form of a film or a covering layer. The process of filling the trenches and the gap between the auxiliary structures with the second isolation structure can be performed in two stages, for example, namely by using a deposition of a material that forms the second isolation structure, followed by e.g., a chemical mechanical polishing process (CMP), whereby the material is pulled back as far as a top side of the auxiliary structures or, in one embodiment, as far as a top side of one of the layers of the auxiliary structures. A change in the polished material during the CMP process can be used for example as an endpoint for the polishing operation. An end point of this type could be reached for instance if a layer of silicon nitride is uncovered after the polishing of a layer of silicon oxide.

Examples of suitable materials for the first and second isolation structures are insulating materials that can be produced on side walls and in a bottom region of trenches. These can be oxides produced by HDP (High Density Plasma), HARP (High Aspect Ratio Process) or else LPCVD (Low Pressure Chemical Vapor Deposition).

In accordance with one embodiment, the uncovered upper sections of the liner are removed. A removal of the liner can extend for example as far as a height level as far as which the second isolation structure was removed. In this case, the liner and also the second isolation structure have a common top side.

The second isolation structure can be pulled back both at most as far as a top side of the mesa regions or else below it.

The first isolation structure can additionally fill a lower region of the trench. Such filling of the lower region of the trench may be caused for example by process-technological aspects, for instance if a growth rate of the first isolation structure on the side walls is less than a growth rate when filling the trench from the bottom region.

By way of example, the first isolation structure can be pulled back in a bottom region of the trenches. Consequently, the first isolation structure covers only the side walls of the trenches.

In accordance with one embodiment, the auxiliary structures are partially removed prior to uncovering the liner sections and are reinforced to form useful structures. In this case, the auxiliary structures can be pulled back for instance in connection with providing the second isolation structure, e.g., by using a CMP process or an etching process that attacks specific layers of the auxiliary structures. The term auxiliary structures herein denotes structures which are partially or else completely removed during the fabrication of a semiconductor device. The term useful structures herein denotes structures which form structural constituent parts of the completed semiconductor device. Such structural constituent parts of the semiconductor device may be for example gate electrodes, insulation layers or semiconductor layers.

In one embodiment, the useful structures are provided as floating gates. The floating gates are for example a structural constituent part of a nonvolatile floating gate memory device such as a floating gate NAND flash memory device.

In accordance with one embodiment, a material of the liner is selected from a group consisting of silicon nitride, polysilicon and hafnium oxide.

The materials of the liner and of the second isolation structure are chosen for example in such a way that the second isolation structure can be etched selectively with respect to the liner. If the isolation structures are formed from silicon oxide, for example, then the liner can be formed from silicon nitride. Materials for the liner can be selected for example with regard to a dielectric constant that is as low as possible and/or low electron trap concentration. A thickness of the liner can be chosen suitably for instance taking account of the etching selectivities that can be obtained in the method sequence, e.g., the etching selectivity between the second isolation structure and the liner, or else taking account of further etching processes in the process sequence, e.g., for pulling back the auxiliary structures. In the case of a liner composed of silicon nitride, the thickness can be chosen for example within the range of 0.1 nm to 5 nm.

One embodiment provides a method for producing a nonvolatile memory device by providing a substrate having trenches and mesa regions and auxiliary structures on the mesa regions. Further method processes that follow involve providing a first isolation structure, which covers side walls and a bottom region of the trenches and at least partially side walls of the auxiliary structures, and providing a liner on the first isolation structure. The trenches and gaps between the auxiliary structures are likewise filled with a second isolation structure, after which the second isolation structure is pulled back and upper sections of the liner are uncovered. In addition, floating gates are formed at least partially instead of the auxiliary structures. Remaining parts of the auxiliary structures can form constituent parts of the floating gates.

In accordance with one embodiment, lower sections of the auxiliary structures respectively form a part of the respective floating gate and an upper section of the auxiliary structures above the respective lower section is respectively removed and a second part of the respective floating gate is respectively formed prior to at least partially uncovering the liner. The materials of the first and second parts of the floating gate can match. The first and second parts of the floating gate jointly form the floating gate as a useful structure. By way of example, NAND strings of a floating gate NAND flash memory device can extend along the mesa regions. A control gate can fill the gaps between adjacent floating gates with an intervening dielectric layer such as e.g., an ONO (Oxide-Nitride-Oxide) layer. A part of the control gate that fills the gaps between adjacent floating gates enables a potential decoupling between adjacent floating gates and an electrical coupling of the control gate to the floating gate.

One embodiment provides an integrated circuit including an isolation arrangement including a first isolation structure, which covers at least side walls of a trench formed in a substrate and extends above a substrate surface as a spacer. The isolation arrangement likewise has a liner covering the first isolation structure at least within the trench, and also a second isolation structure, which at least partially fills the trench. The isolation arrangement is therefore suitable for isolating structures within or above the trenches from further structures within or above adjacent mesa regions. Consequently, it is possible for example to obtain an electrical isolation between a control electrode of a NAND flash memory that reaches the substrate surface and the semiconductor substrate.

The spacer can be covered for example by the liner.

In accordance with one embodiment, the second isolation structure ends at a level of or above the substrate surface. If a conductive structure is produced on the second isolation structure in this case, then the underside of the conductive structure lies above the substrate surface. A direct lateral connection between the conductive structure and the substrate and losses in the breakdown field strength that are possibly associated with that can thereby be avoided. A shortest connection between the substrate, which can include e.g., a semiconductor zone of memory cell transistors, and the conductive structure, which can be formed e.g., as a control electrode of a nonvolatile memory cell, is effected transversely through the spacer. Through suitable dimensioning of the spacer it is possible to obtain a desired dielectric strength between the substrate and the conductive structure. If the spacer is additionally covered by the liner, then the liner, if the latter is composed of an insulating material, additionally contributes to the dielectric strength between the substrate and the conductive structure.

It is likewise possible, however, for the second isolation structure also to end below the substrate surface of the mesa region.

One embodiment provides a nonvolatile memory device including a first isolation structure, which covers at least side walls of a trench formed in a substrate and extends above a substrate surface as a spacer along a side wall of a floating gate. The nonvolatile memory device additionally has a liner covering the first isolation structure at least within the trench, and a second isolation structure, which at least partially fills the trench. The trench can be formed as shallow trench isolation in order to electrically isolate adjacent strips of active regions with memory cells, e.g., NAND strings, from one another. The spacer makes it possible to increase the dielectric strength between the substrate and a conductive structure adjacent to the spacer, such as a control electrode for instance.

In accordance with one embodiment, the spacer is covered by the liner. If the liner is formed from a dielectric material, then it can also contribute to increasing the dielectric strength between the substrate and the conductive structure.

One embodiment provides a memory card including nonvolatile memory device having features described above.

One embodiment provides an electrical apparatus including a memory card interface, a memory card slot connected to the memory card interface, and a memory card that can be inserted onto the memory card slot, wherein the memory card has features described above. The electrical apparatus can be a personal computer (PC), a digital image camera, a digital video camera, a mobile telephone, a portable media player such as an MP3 player, or else a PDA (Personal Digital Assistant).

FIG. 1A illustrates a schematic cross-sectional view of a substrate excerpt during a method for forming an isolation arrangement for a nonvolatile memory device in accordance with one embodiment. Trenches 3 project into a semiconductor substrate 1, e.g., a semiconductor wafer composed of silicon, from a surface 2, mesa regions 4 being formed between the trenches. Auxiliary structures 5 are formed on the mesa regions 4, which auxiliary structures can be constructed from a plurality of layers such as e.g., a tunnel insulation layer 6, a first part of a floating gate 7, an auxiliary layer 8 and a further auxiliary layer 9. By way of example, the tunnel insulation layer 6 can be composed of silicon oxide, the first part of the floating gate 7 can be composed of polysilicon, the auxiliary layer 8 can be composed of silicon nitride and the further auxiliary layer 9 can be composed of silicon oxide. The materials specified for the layers of the auxiliary structure 5 and also the sequence of the layers serve merely as an example and are in no way restrictive.

In order to form a first isolation structure, an insulating material is produced on side walls and a bottom region of the trenches 3 and also on a surface of the auxiliary structure 5. The insulating material can include for example a sequence of a plurality of insulating material components, e.g., a first insulating material component, which is present on the side walls and the bottom region of the trenches, and also a further insulating material component, which surrounds the trenches 3 and also the auxiliary structure 5. The first insulating material component can be a thermal insulation layer 10, for example, which can be used to reduce process-technologically governed structural damage to the trenches in the side wall region and bottom region. The further insulating material component in the form of a further insulating layer 11 can be produced for example with the aid of methods suitable for filling and lining trenches with a high aspect ratio. By way of example, the thermal insulation layer 10 can be formed as thermal oxide, wherein structural damage can be oxidized after the formation of the trenches in the side wall region and bottom region. The further insulation layer 11 formed above the thermal insulation layer 10 can be formed for example as HDP oxide.

Figure 1B:
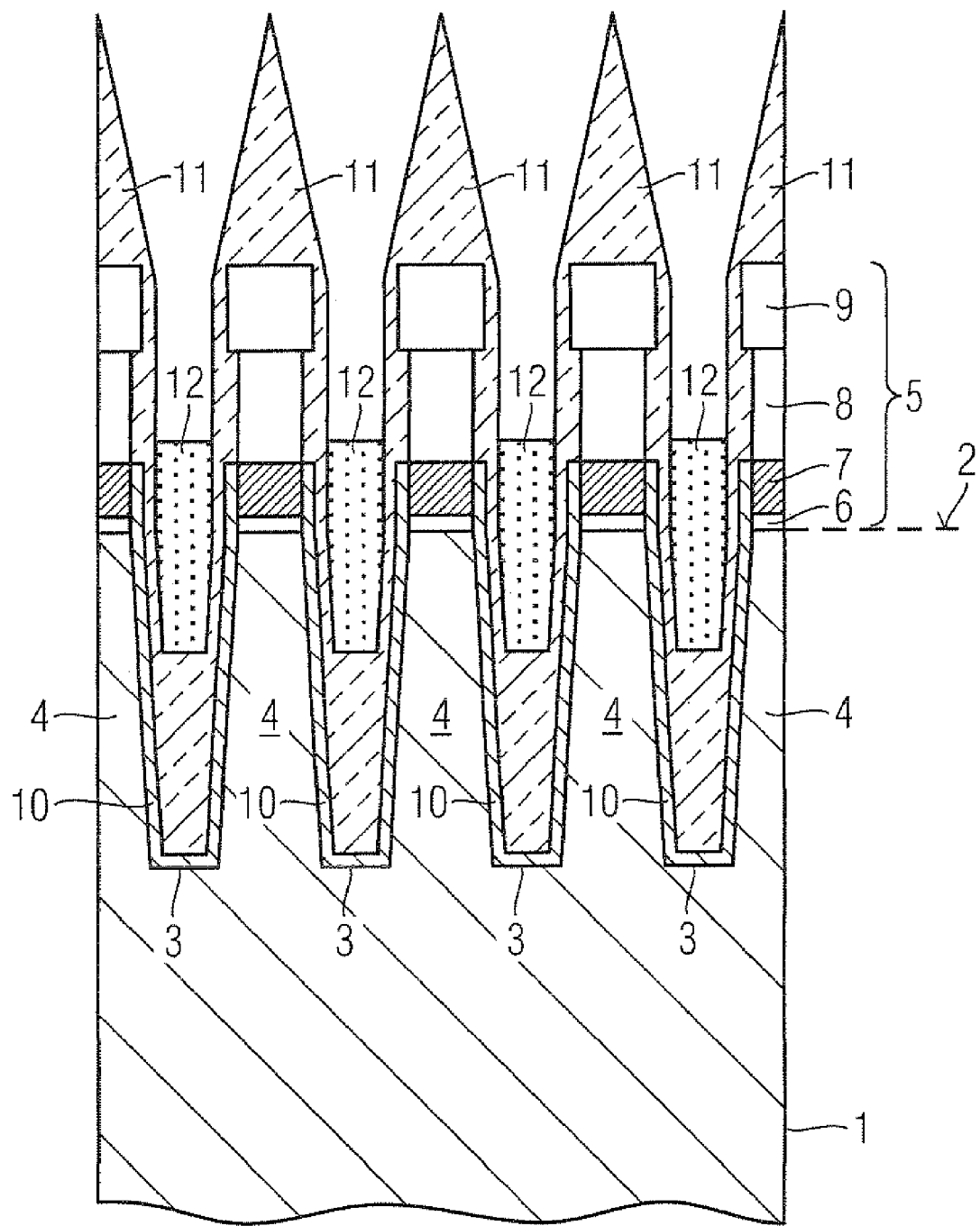

In the case of the schematic cross-sectional view of the substrate excerpt as illustrated in FIG. 1B, the trenches 3 and also a part of a gap between adjacent auxiliary structures 5 are filled with a sacrificial filling 12. The sacrificial filling 12 can be formed for example as photo resistor. In this case, the photo resist can firstly be spun on and be etched back as far as a desired height level in a later step. If the material of the sacrificial filling 12 can be etched selectively with respect to the further insulation layer 11, then the sacrificial filling can be pulled back without removing the further insulation layer 11.

Figure 1C:
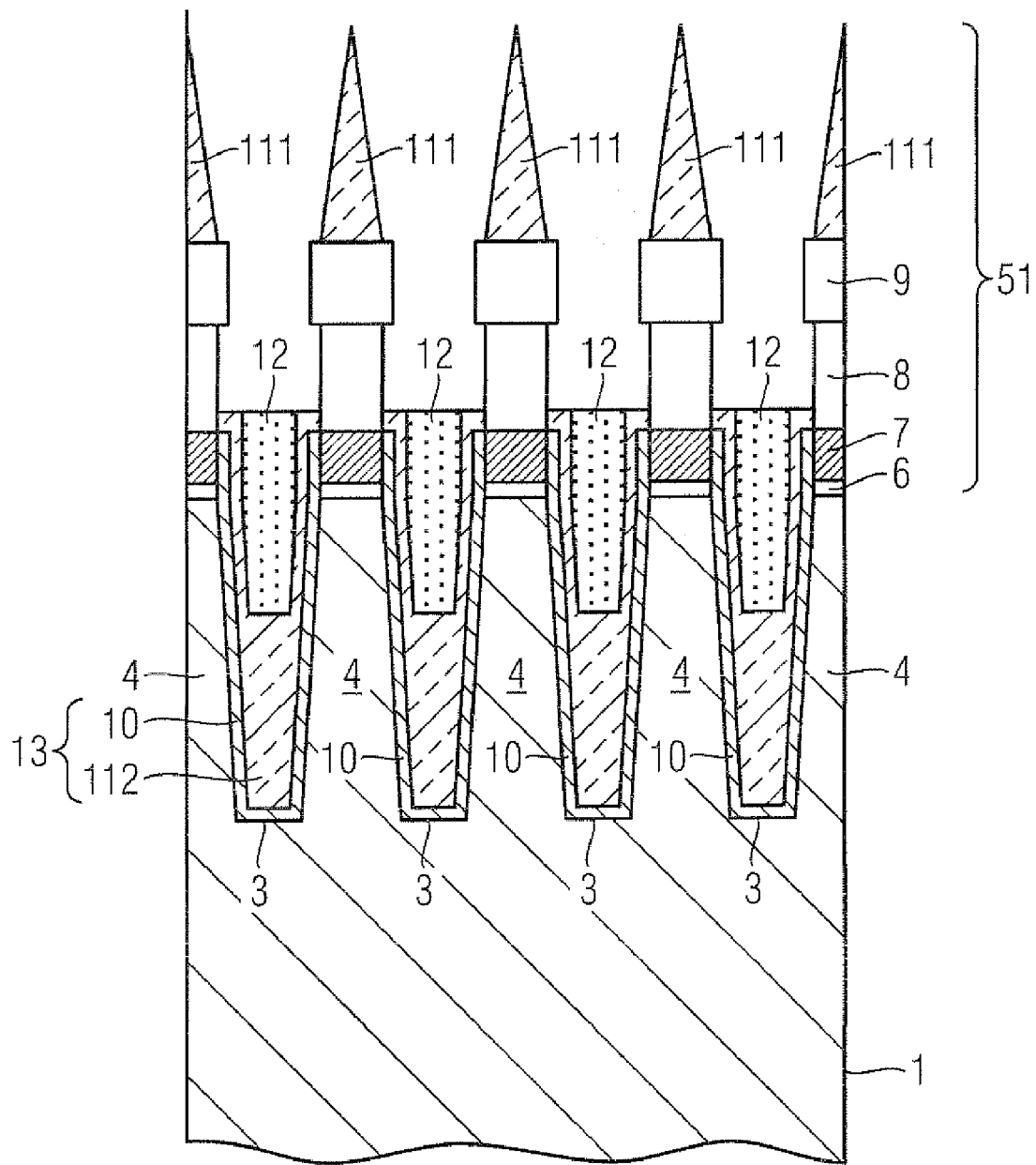

The definition of a first isolation structure 13 is explained referring to the schematic cross-sectional view of the substrate excerpt illustrated in FIG. 1C. After the removal of the further insulation layer 11 in the side wall region of the auxiliary layers 8 and 9 down to a height level of the sacrificial filling 12, an upper residue 111 of the further insulation layer remains, which together with the tunnel insulation layer 6, the first part of the floating gate 7 and also the auxiliary layers 8 and 9 forms the auxiliary structure 51. A lower residue 112 of the further insulation layer together with the thermal insulation layer 10 covers the side walls and the bottom region of the trenches 3 and extends along a sidewall of the auxiliary structure 51 as far as the top side of the sacrificial filling 12. The lower residue 112 of the further insulation layer together with the thermal insulation layer 10 forms the first isolation structure 13.

Figure 1D:
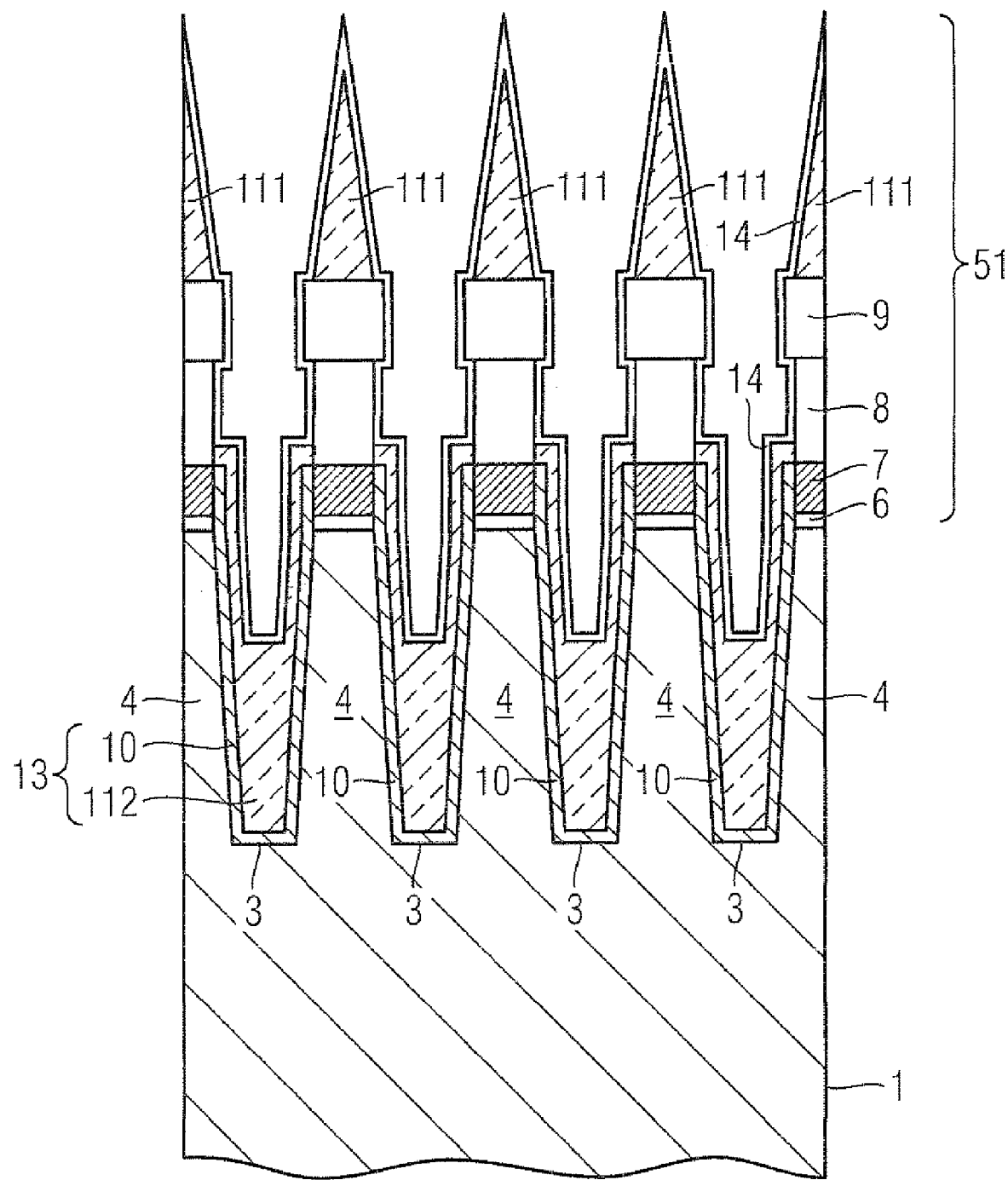

After the removal of the sacrificial filling 12, a liner material 14 is applied to the first isolation structure 13 and also the auxiliary structure 51, which can be gathered from the schematic cross-sectional view of the substrate excerpt in FIG. 1D. The liner material can be silicon nitride, for example.

Figure 1E:
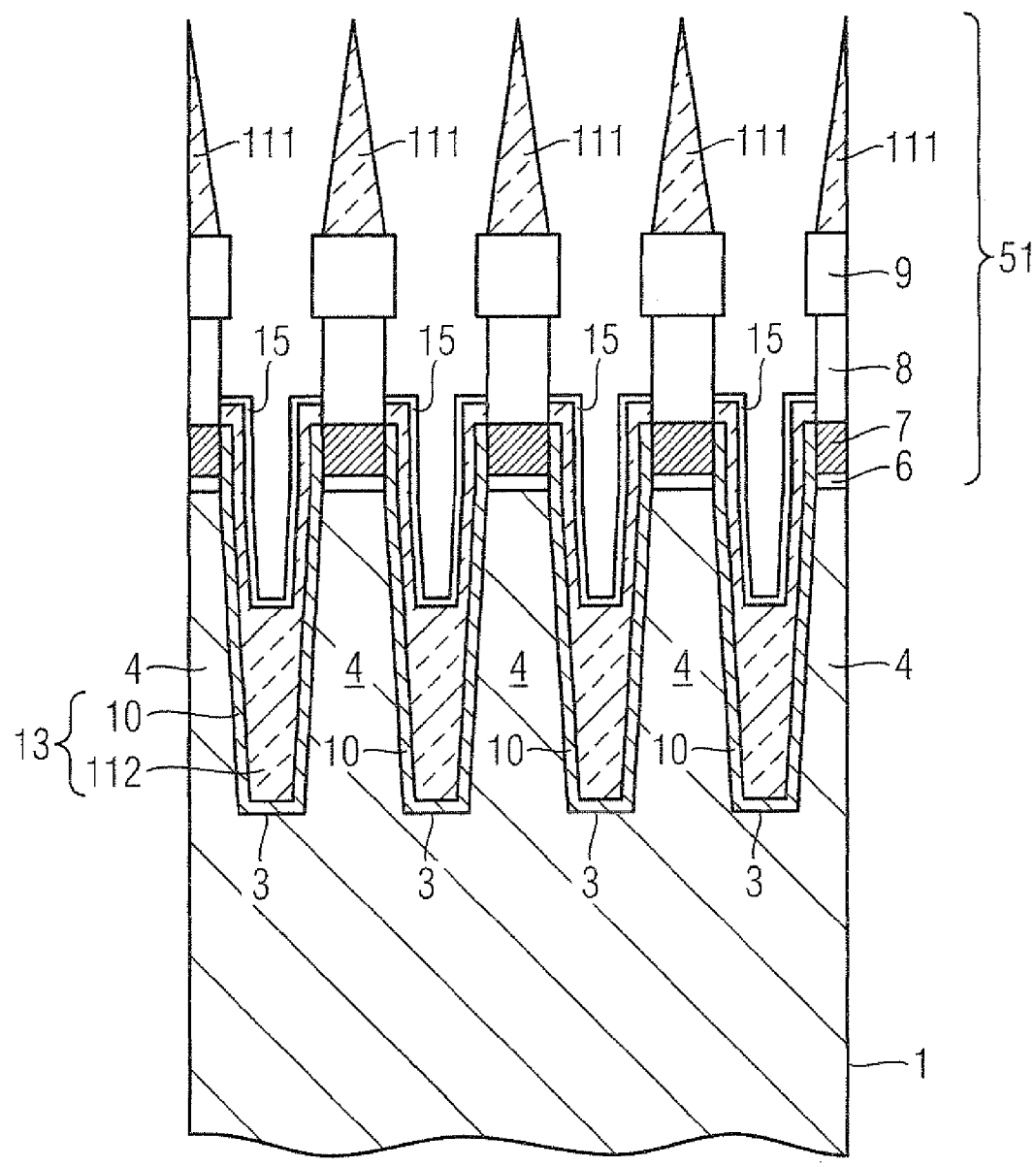

As is illustrated in the schematic cross-sectional view of the substrate excerpt in FIG. 1E, the liner material 14 is pulled back, the liner material still covering the first isolation structure 13 in the form of liner 15. The liner material 14 can be pulled back for example in a manner explained in connection with the formation of the first isolation structure 13 in FIGS. 1B and 1C, with the aid of a sacrificial filling.

Figure 1F:
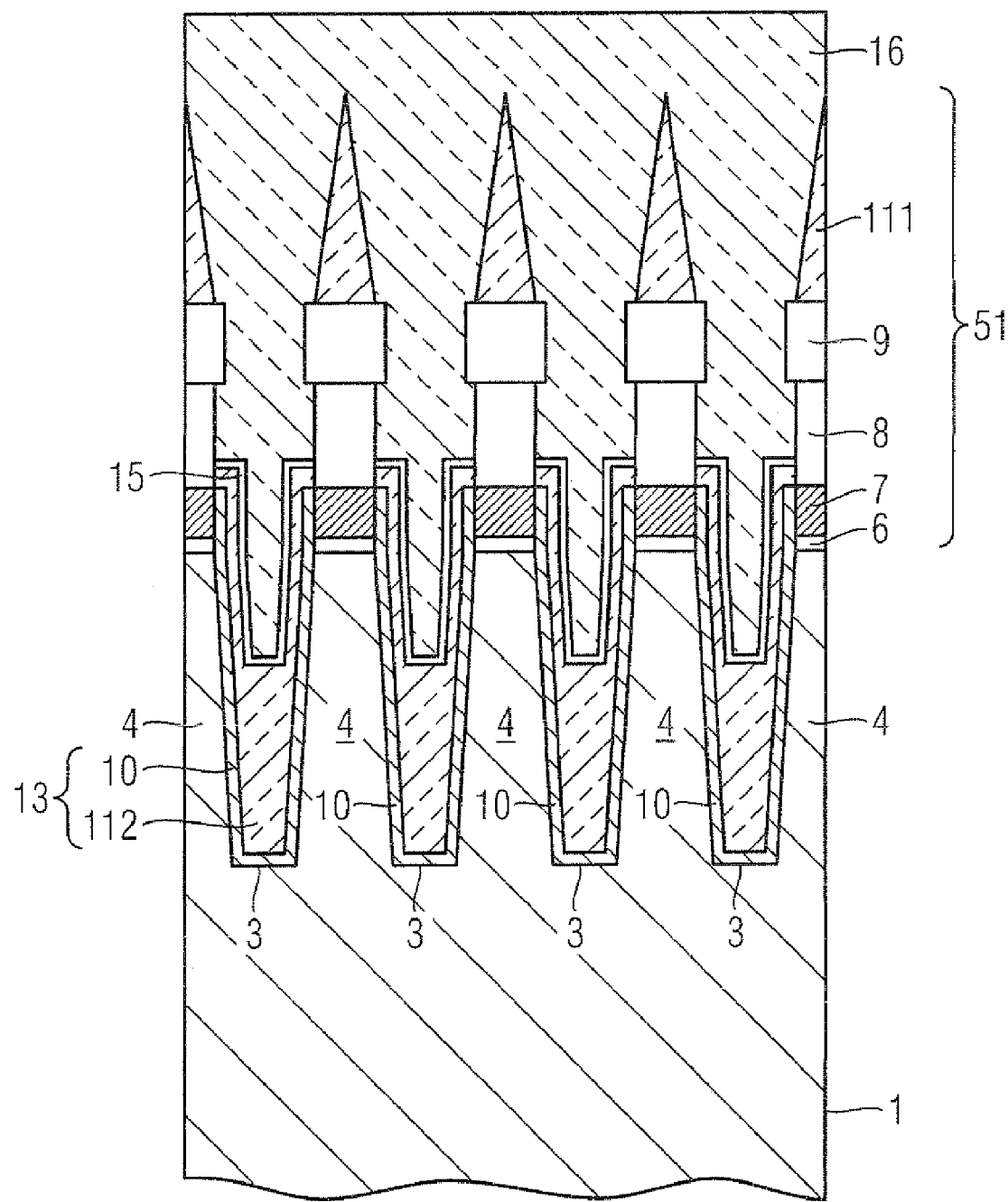

Referring to the schematic cross-sectional view of the substrate excerpt as illustrated in FIG. 1F, a next insulating material component 16 for filling the trenches 3 and the gaps between the auxiliary structure 51 is applied. The next insulating material component 16 can be chosen as silicon oxide, for example.

Figure 1G:
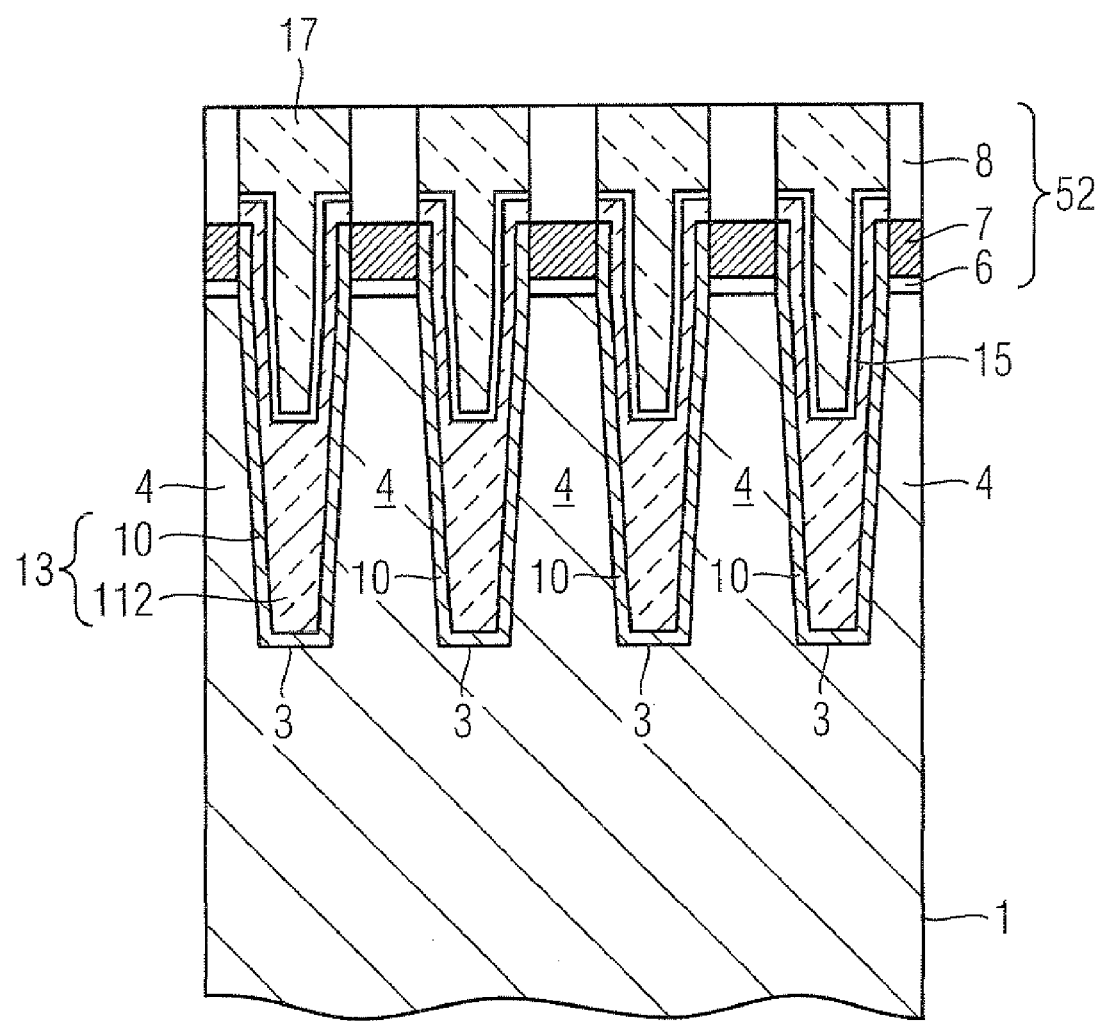

After the application of the next insulating material component 16, the latter and also a part of the auxiliary structure 51 are pulled back, e.g., with the aid of a chemical mechanical polishing process (see schematic cross-sectional view of the substrate excerpt of FIG. 1G. After the process of pulling back parts of the next insulating material component 16 and of the auxiliary structure 51, there remain a lower residue 17 of the next insulating material component and the auxiliary structure 52, which now includes the tunnel insulation layer 6, the first part of the floating gate 7 and the auxiliary layer 8. A process of pulling back the auxiliary structure 51 and the next insulating material component 16 can be stopped for example upon reaching the auxiliary layer 8 serving as an end point.

Figure 1H:
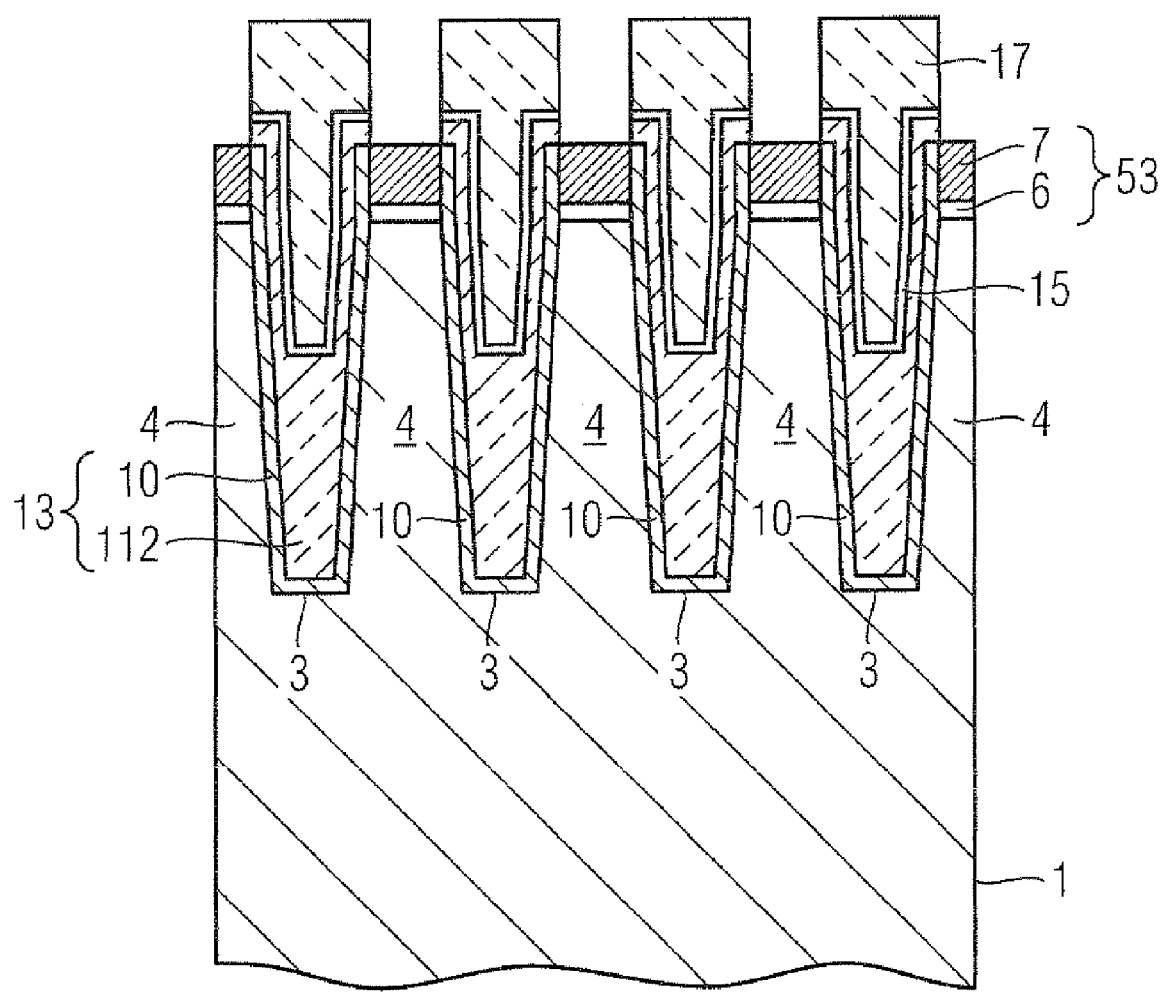

As is illustrated in the schematic cross-sectional view of the substrate excerpt in FIG. 1H, an auxiliary structure 53 constructed from the tunnel insulation layer 6 and the first part of the floating gate 7 remains after the removal of the auxiliary layer 8. As can be gathered from FIG. 1G, the auxiliary layer 8 is removed selectively with respect to the lower residue 17 of the next insulating material component. When removing the auxiliary layer 8, care should be taken to ensure that the liner 15 is not concomitantly removed in an inappropriate manner in the process. If the materials of the auxiliary layer 8 and the liner 15 match, for example, then impairment of the liner 15 when removing the auxiliary layer 8 can be counteracted by a suitable choice of a liner thickness.

Figure 1I:
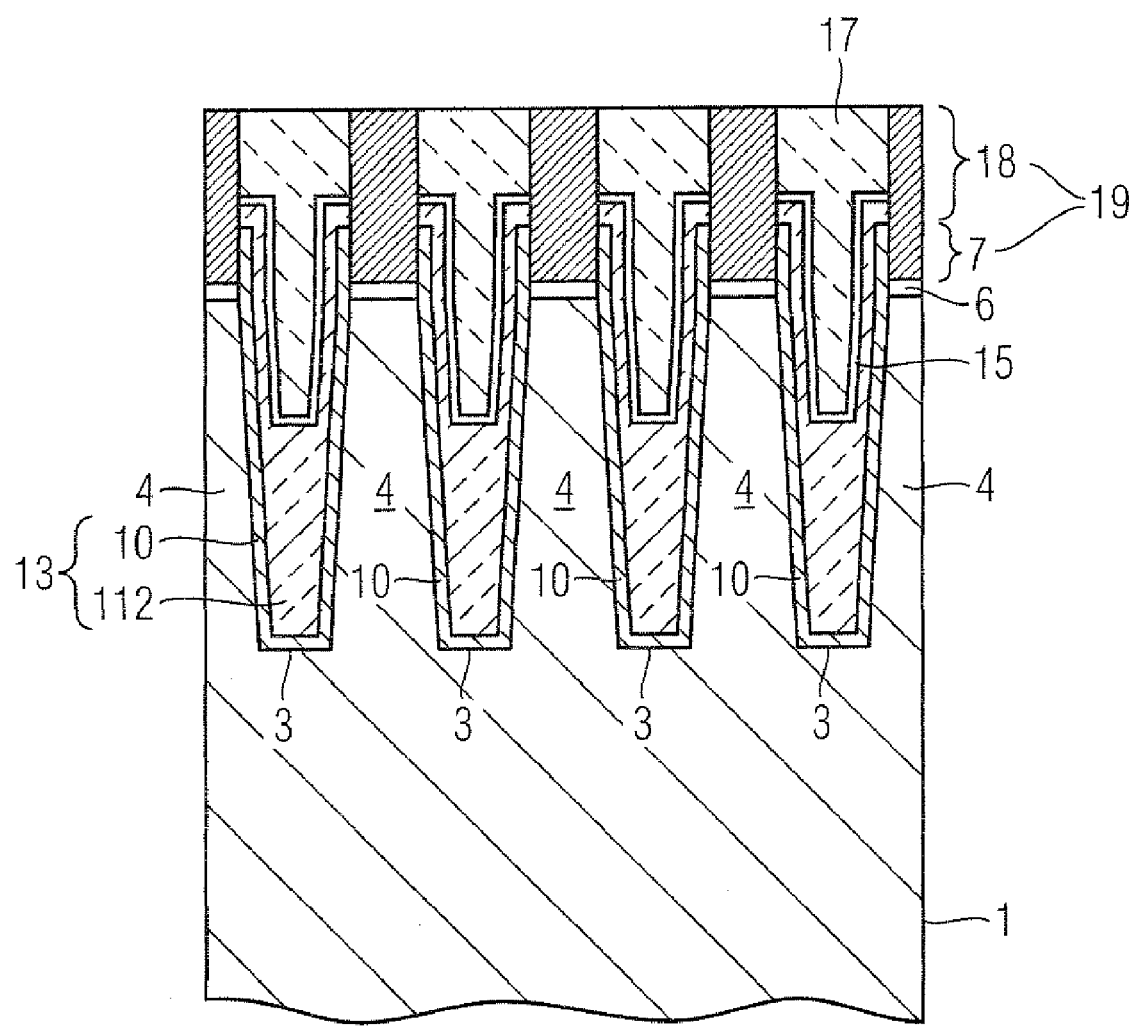

Referring to the schematic cross-sectional view of the substrate excerpt in FIG. 1I, the auxiliary structure 53 is reinforced with a second part 18 of a floating gate. The first part 7 and the second part 18 of the floating gate form the floating gate 19. The first and second parts 7, 18 of the floating gate 19 can be composed of the same material, e.g., of polysilicon. It is likewise possible to use different materials for the first part 7 and the second part 18 of the floating gate 19. The second part 18 of the floating gate 19 can be formed in a two-stage process, for example, wherein firstly a material of the second part 18 is deposited as far as above the lower residue 17 of the next insulating material component, followed by a process of pulling back the material as far as the top side of the lower residue 17, e.g., by using chemical mechanical polishing.

Figure 1J:
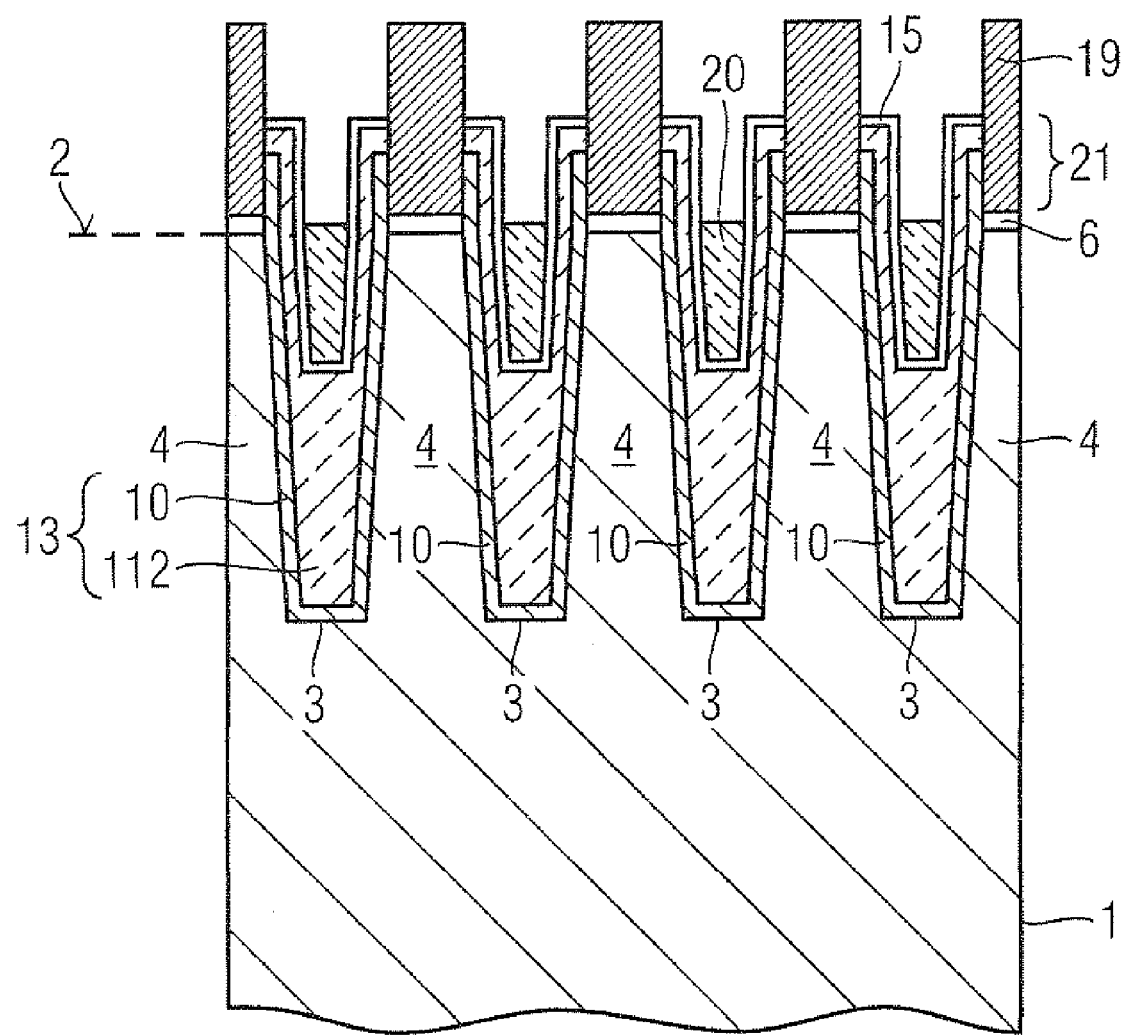

In the schematic cross-sectional view of the substrate excerpt of FIG. 1J, the lower residue 17 of the next insulating material component is partially removed, e.g., as far as the surface 2, and forms a second isolation structure 20. The part of the first isolation structure 13 in the side wall region of the floating gate 19 forms a spacer 21 covered by the liner 15. If subsequent processes involve filling for example a control electrode between adjacent floating gates 19 with an intervening dielectric layer such as e.g., an ONO (Oxide-Nitride-Oxide) layer, then the spacer 21 and also the liner 15 (if the latter is composed of an insulating material) ensure a dielectric strength of the control electrode with respect to the mesa region 4. A desired dielectric strength can be obtained by suitable definition of the thicknesses of the spacer 21 and of the liner 15.

Figure 1K:
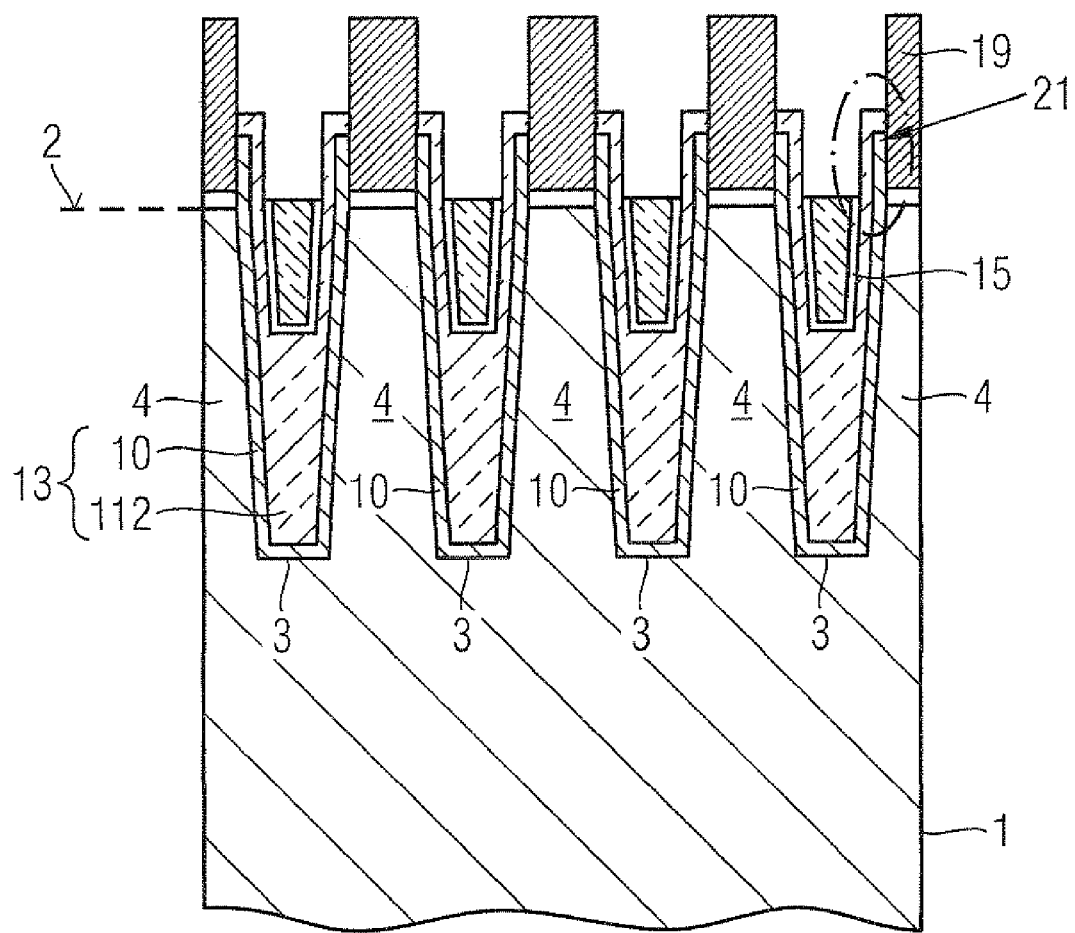

Optionally with respect to the process stage illustrated in FIG. 1J, it is possible to remove the liner 15 on the side wall of the spacer 21, which can be gathered from the schematic cross-sectional view of the substrate excerpt in FIG. 1K.

Figure 2A:
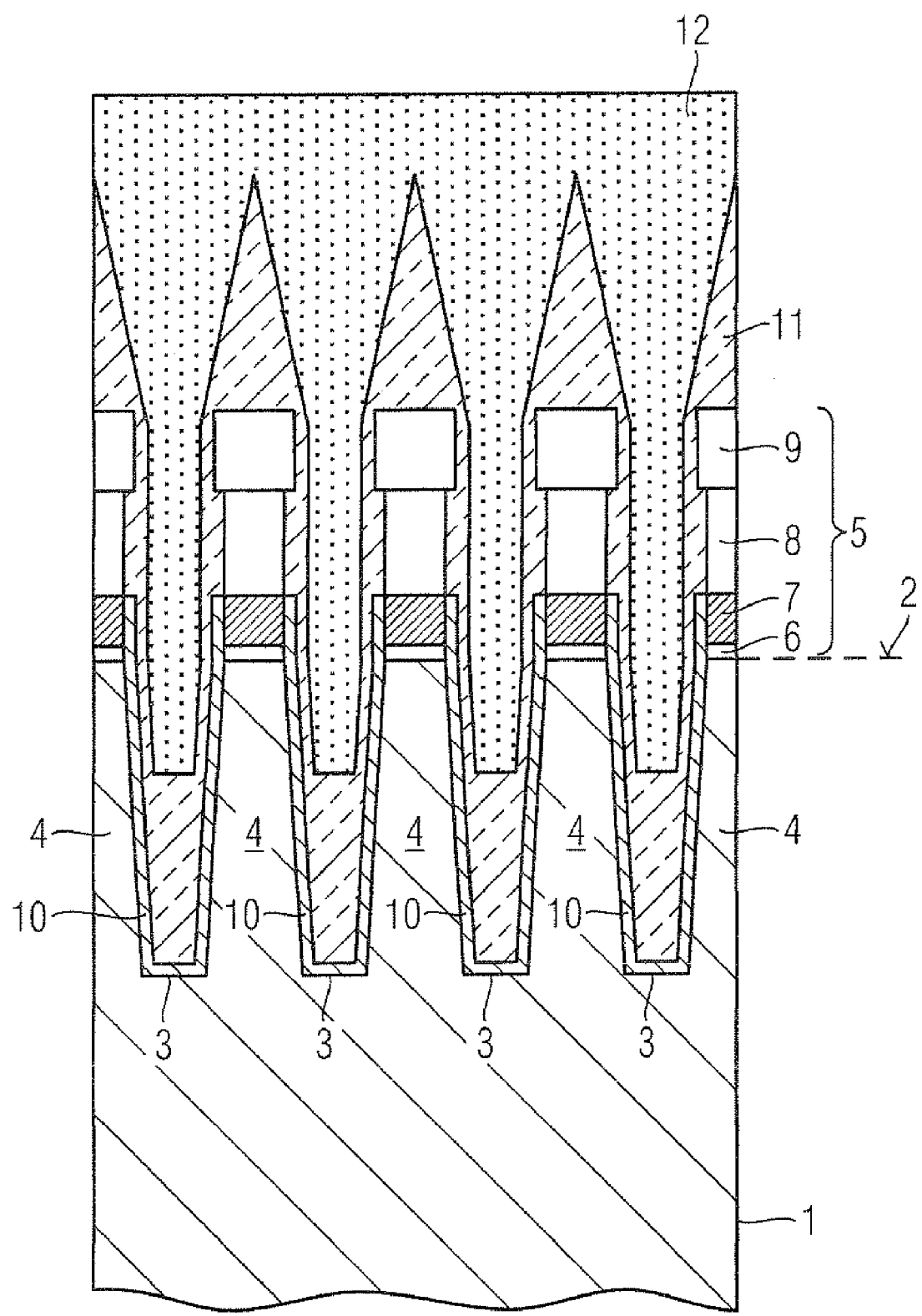

FIG. 2A illustrates a schematic cross-sectional view of a substrate excerpt during a method for forming an isolation arrangement for a nonvolatile memory device in accordance with a further embodiment. The process stage illustrated in FIG. 2A corresponds to the process stage in FIG. 1B of the previous embodiment, apart from the fact that the sacrificial filling 12 has not yet been pulled back. Corresponding or similar elements in the figures are provided with the same reference symbols.

Figure 2B:
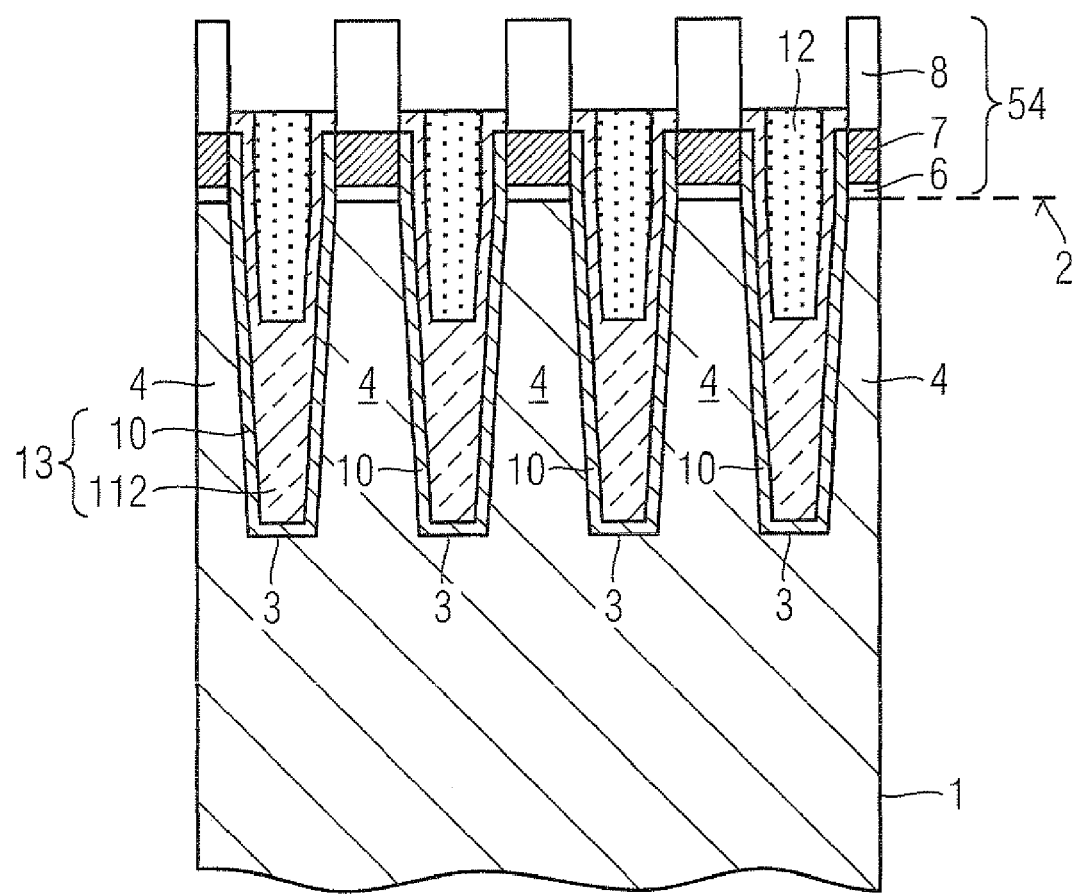

As is illustrated in the schematic cross-sectional view of the substrate excerpt in FIG. 2B, a process of pulling back the sacrificial filling 12 takes place not selectively with respect to the materials of the further insulation layer 11 and of the further auxiliary layer 9, which for instance can both be formed from oxide. However, there is a selectivity with respect to the material of the auxiliary layer 8, which can be formed for example from silicon nitride. Consequently, parts of the further insulation layer 11 and the further auxiliary layer 9 are also removed when pulling back the sacrificial filling 12. A remaining auxiliary structure 54 is now constructed from the tunnel insulation layer 6, the first part of the floating gate 7 and the auxiliary layer 8. The lower residue 112 of the further insulation layer together with the thermal insulation layer 10 forms the first isolation structure 13.

Figure 2C:
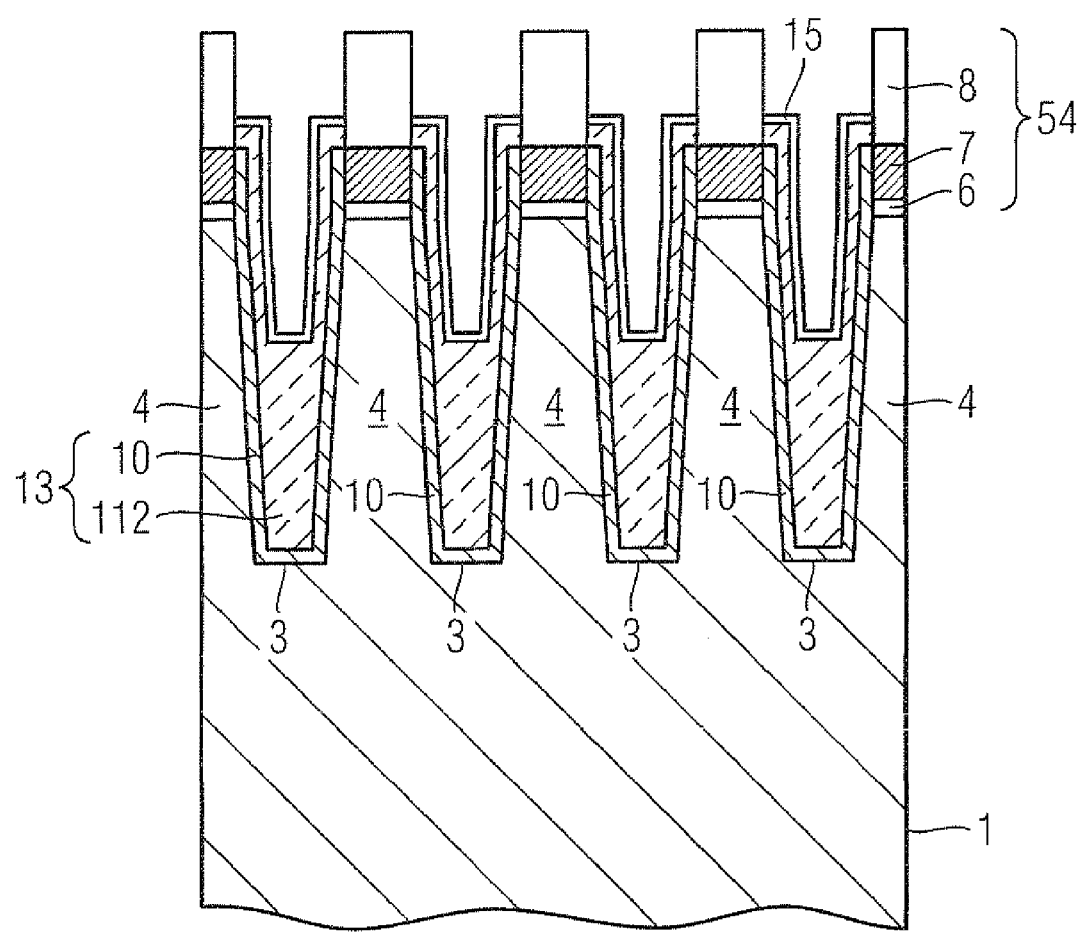

After the removal of the sacrificial filling 12, the liner 15 is formed on the first isolation structure 13, which is illustrated in the schematic cross-sectional view of the substrate excerpt in FIG. 2C.

Figure 2D:
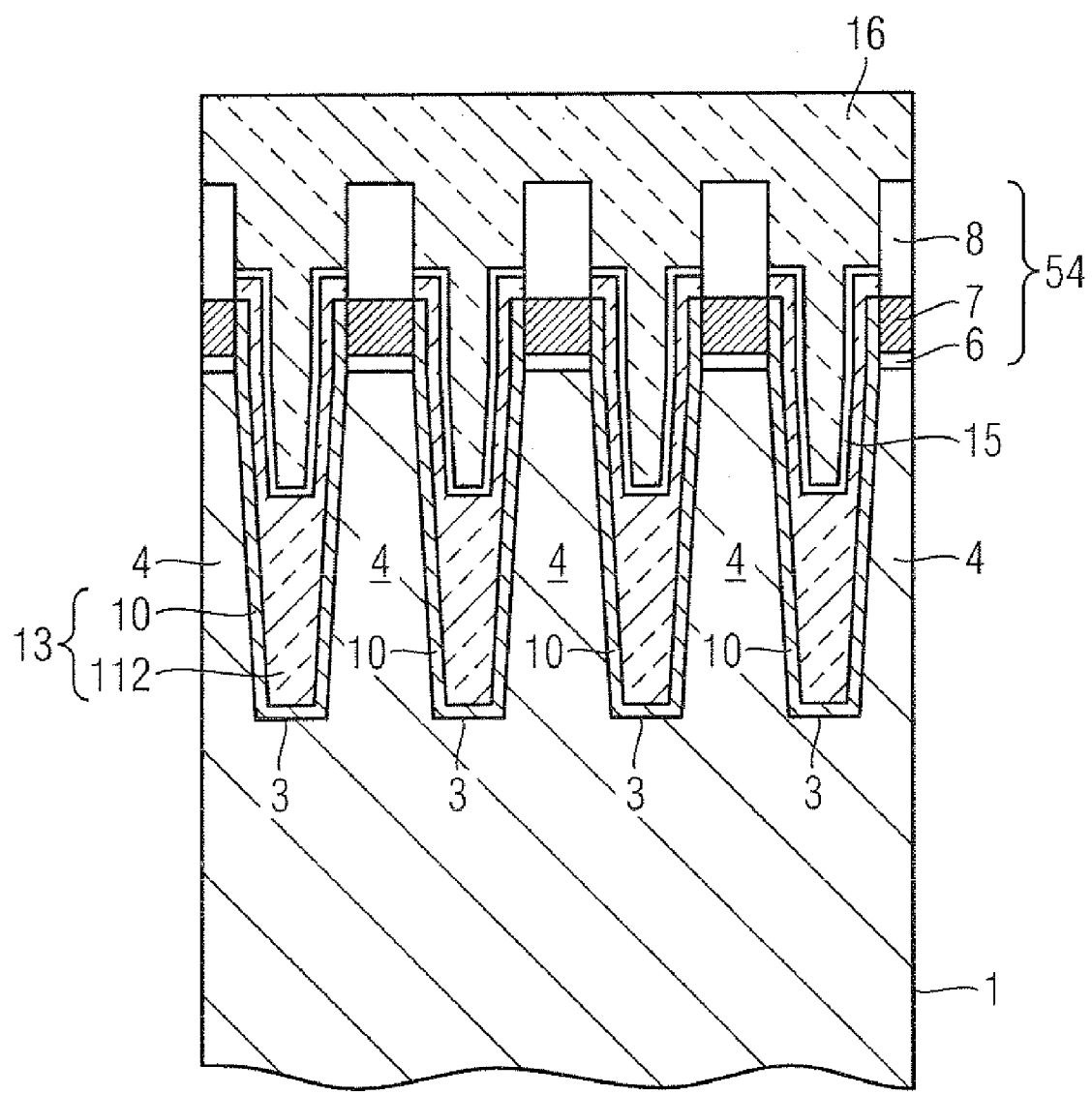

The formation of the liner 15 is followed by filling the trench 13 and the gap between adjacent auxiliary structures 54 with the next insulating material component 16, which is illustrated in the schematic cross-sectional view of the substrate excerpt in FIG. 2D.

Figure 2E:
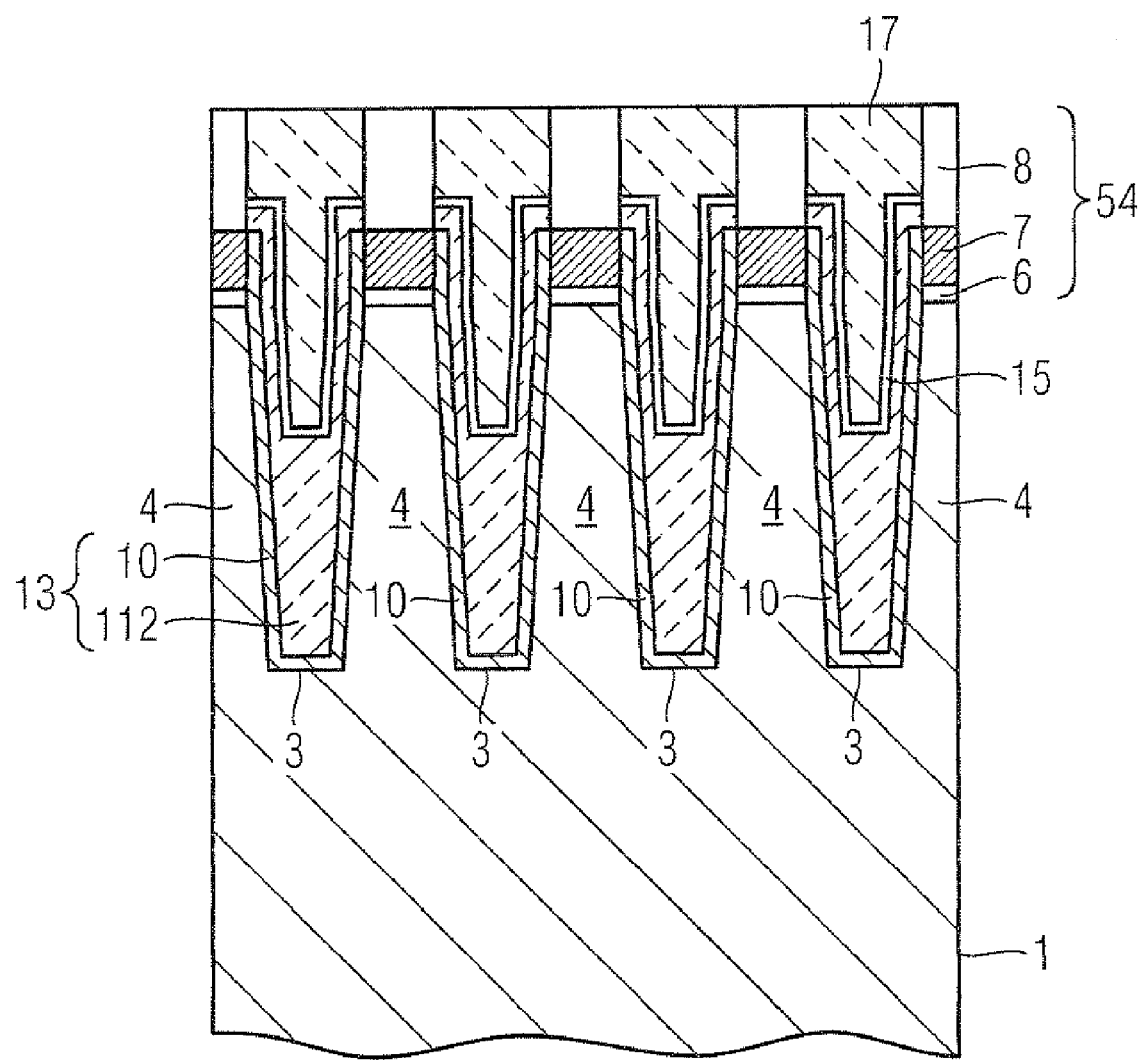
Figure 2F:
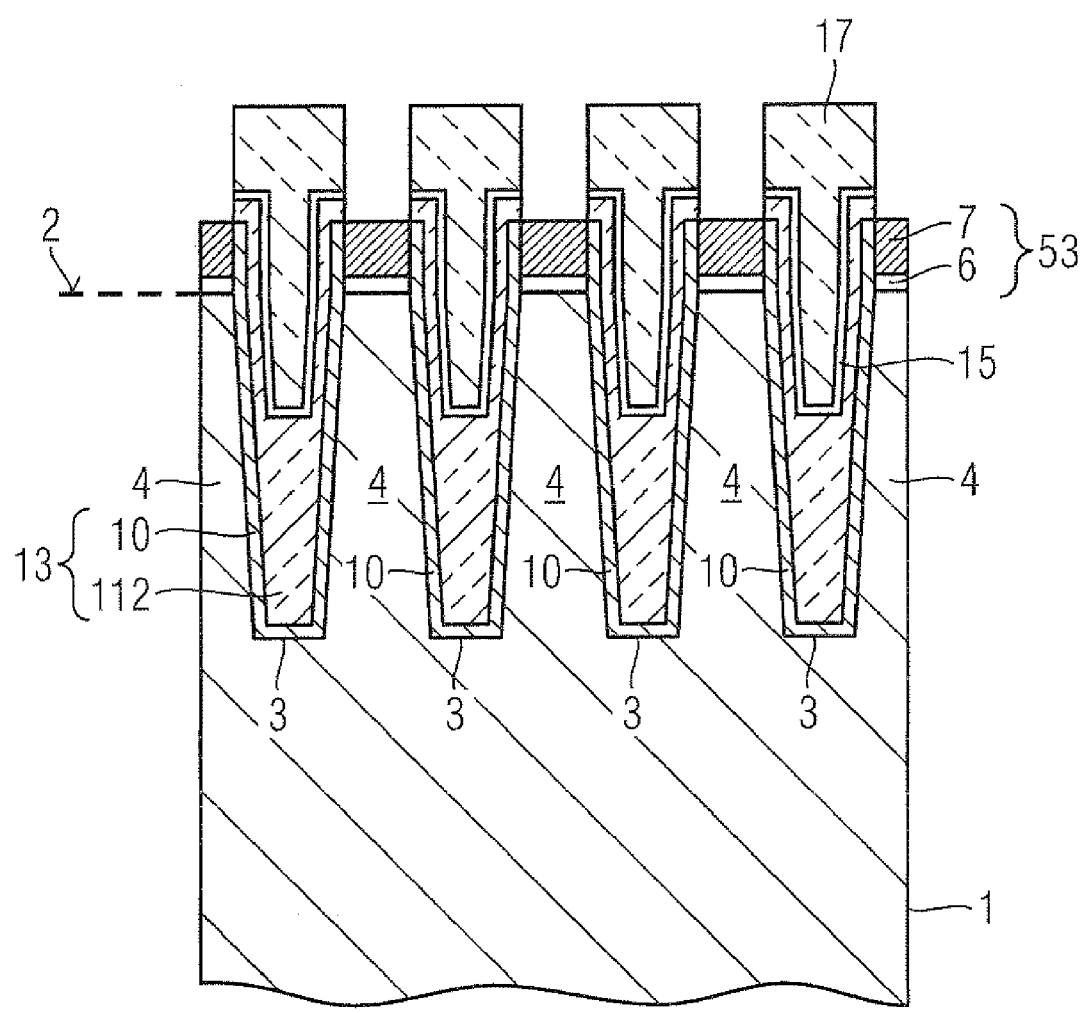
Figure 2G:
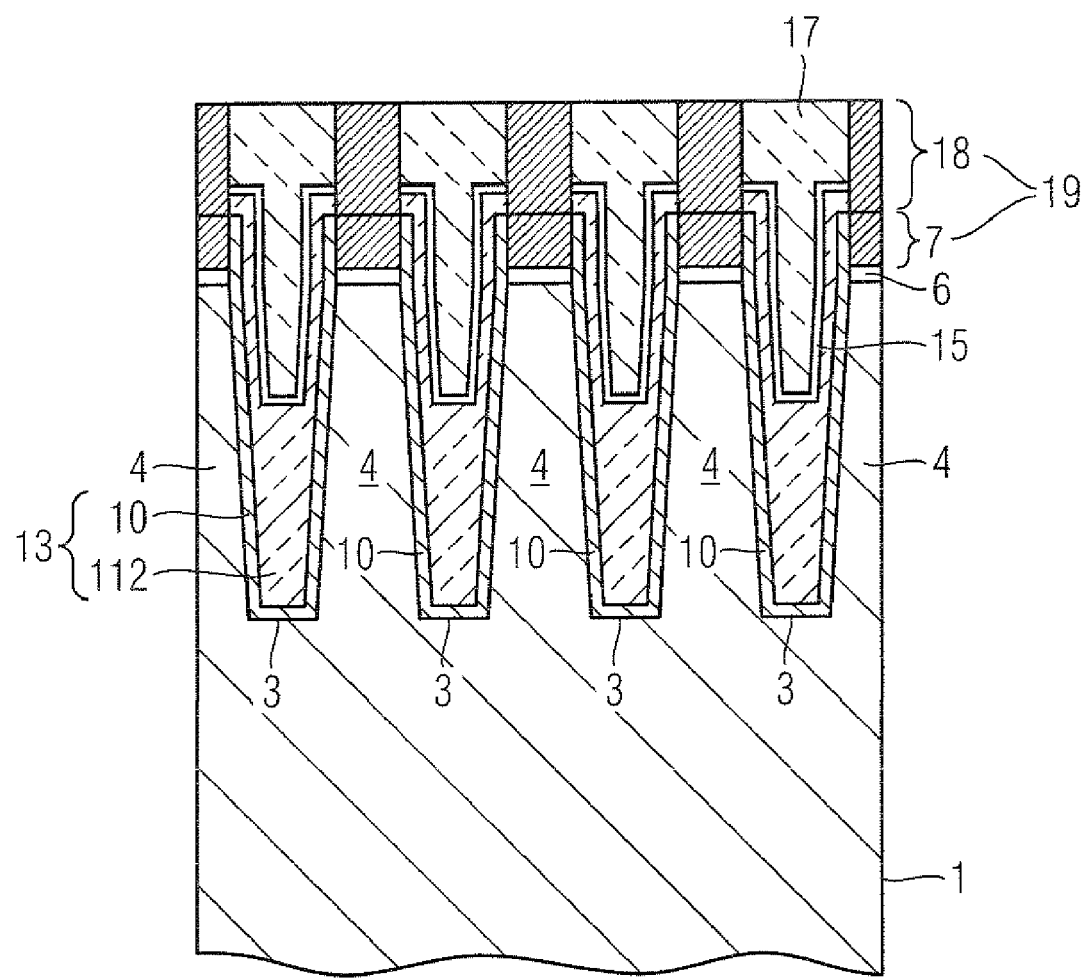
Figure 2H:
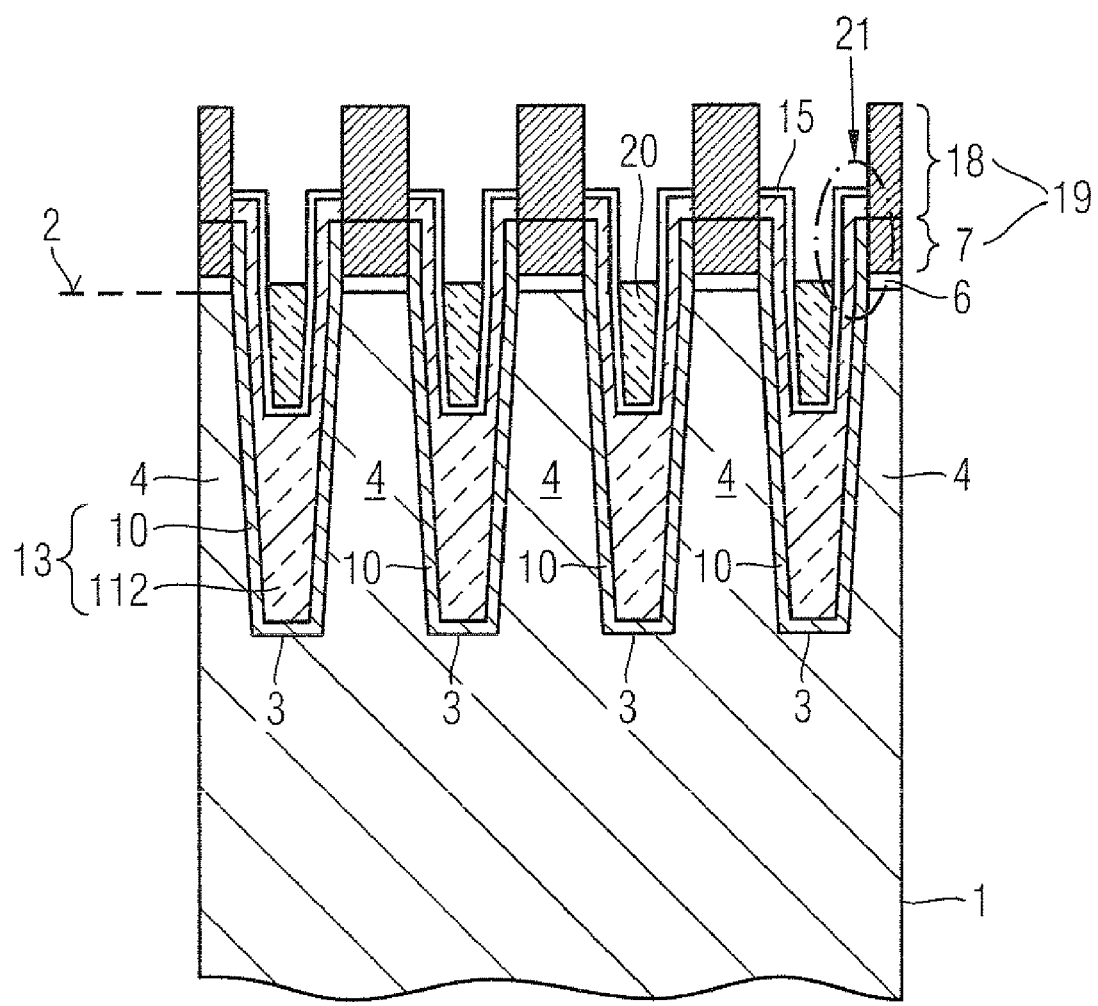
Figure 21:
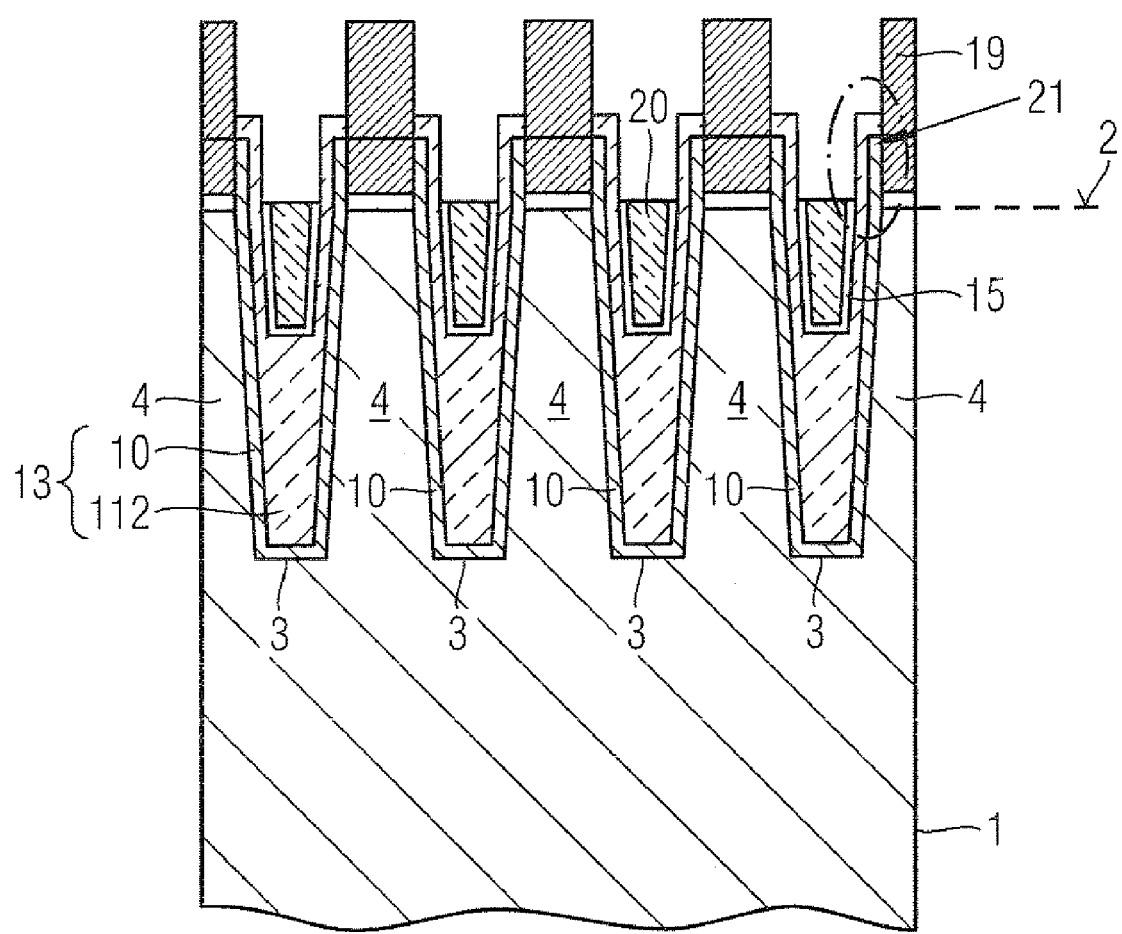

As can be gathered from the schematic cross-sectional view of the substrate excerpt in FIG. 2E, the next insulating material component is removed as far as the top side of the auxiliary structure 54 and remains as lower residue 17.

Further method features which lead to the process stages illustrated in the form of schematic cross-sectional views in FIGS. 2F-2I correspond to the method features of the previous embodiment with regard to FIG. 1H-1K, for which reason a repetition of the description is dispensed with at this juncture and reference is made instead to the description of the figures appertaining to FIGS. 1H-1K.

Figure 3:
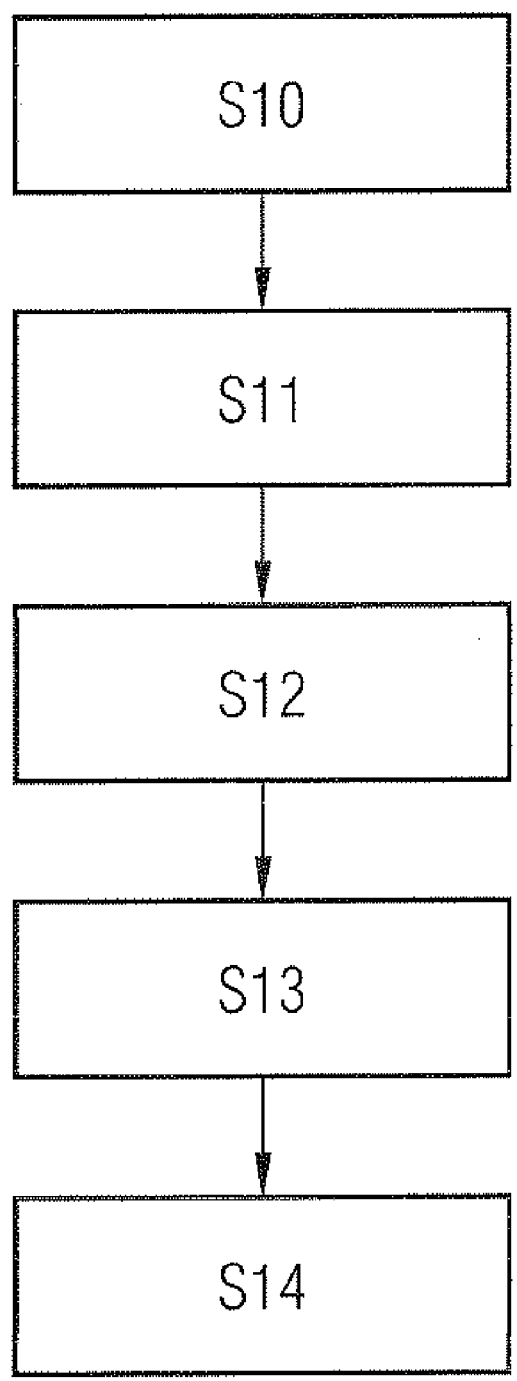
FIG. 3 illustrates a schematic process sequence for producing an isolation arrangement in accordance with one embodiment.

FIG. 3 illustrates a schematic method flowchart for forming an isolation arrangement in accordance with one embodiment. A process S10 involves providing a substrate having trenches and mesa regions and also auxiliary structures on the mesa regions. S11 then involves providing a first isolation structure, which covers side walls and a bottom region of the trenches and at least partially side walls of the auxiliary structures. Afterward, S12 involves providing a liner on the first isolation structure, after which the trenches and gaps between the auxiliary structures are filled with a second isolation structure in S13. S14 involves pulling back the second isolation structure, wherein upper sections of the liner are uncovered.

Figure 4:
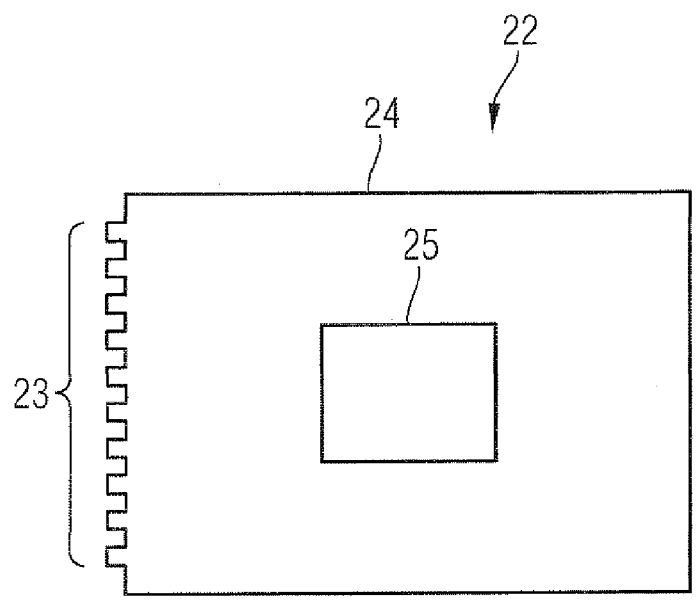
FIG. 4 illustrates a schematic view of a memory card in accordance with one embodiment.

FIG. 4 illustrates a schematic view of a memory card 22 in accordance with one embodiment. The memory card has a nonvolatile memory device 25 within a housing 24 provided with a pin arrangement 23, wherein the non-volatile memory device 25 includes an isolation arrangement in accordance with one of the embodiments described above.

Figure 5:
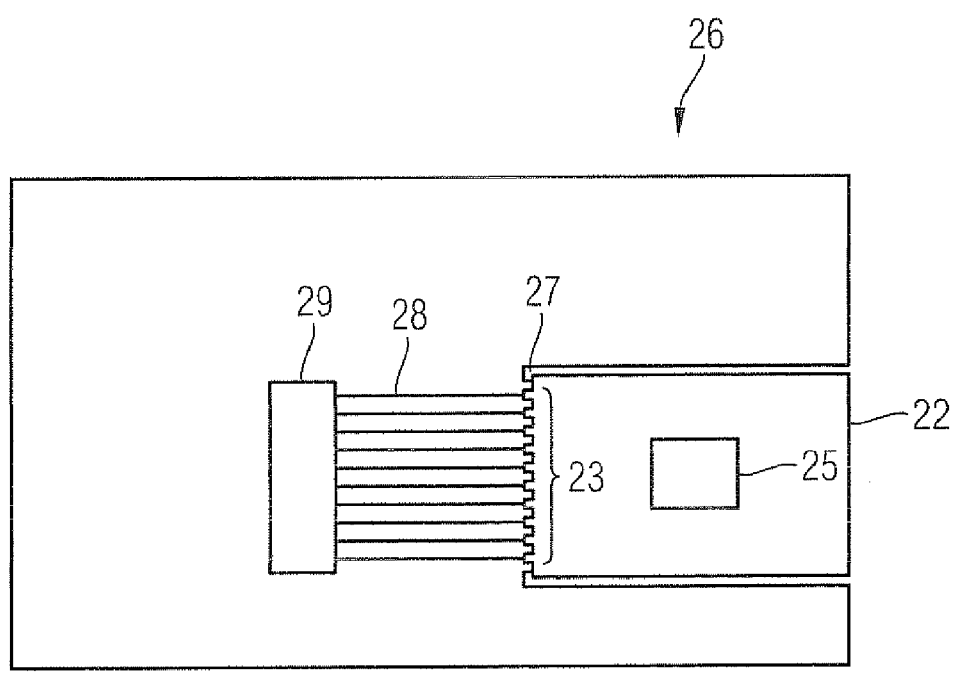
FIG. 5 illustrates a schematic view of an electrical apparatus in accordance with one embodiment.

FIG. 5 outlines a schematic view of an electrical apparatus. The electrical apparatus can be embodied for example as a PC, digital image camera, digital video camera, PDA, mobile telephone or else media player. The electrical apparatus 26 is provided with a memory card slot 27, into which a memory card 22 as explained in connection with FIG. 4 can be inserted. The memory card is connected via its pin arrangement 23 and lines 28 to a memory card interface 29 of the electrical apparatus 26.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit including an isolation arrangement comprising:
   providing a substrate having trenches and mesa regions and also auxiliary structures on the mesa regions;
   providing a first isolation structure, which covers side walls and a bottom region of the trenches and at least partially covers side walls of the auxiliary structure;
   providing a liner on the first isolation structure;
   filling the trenches and gaps between the auxiliary structures with a second isolation structure; and pulling back the second isolation structure, wherein upper sections of the liner are uncovered;
   partially removing the auxiliary structures prior to uncovering the liner sections; and reinforcing the auxiliary structure to form useful structures.

2. The method of claim 1, comprising removing the uncovered upper sections of the liner.

3. The method of claim 1, wherein the second isolation structure initially extends above the mesa regions, and wherein pulling back the second isolation structure comprises pulling back the second isolation structure at most as far as a top side of the mesa regions.

4. The method of claim 1, comprising pulling back the second isolation structure as far as below a top side of the mesa regions.

5. The method of claim 1, comprising wherein the first isolation structure fills a lower region of the trenches.

6. The method of claim 1, comprising pulling back the first isolation structure in a bottom region of the trenches.

7. The method of claim 1, comprising selecting a material of the liner from a group consisting of silicon nitride, polysilicon and hafnium oxide.

8. A method for producing a nonvolatile memory device comprising:
   providing a substrate having trenches and mesa regions and also auxiliary structures on the mesa regions;
   providing a first isolation structure, which covers side walls and a bottom region of the trenches and at least partially covers side walls of the auxiliary structures;
   providing a liner on the first isolation structure;
   filling the trenches and gaps between the auxiliary structures with a second isolation structure; and pulling back the second isolation structure, wherein upper sections of the liner are uncovered; and
   forming floating gates at least partially instead of the auxiliary structures; wherein lower sections of the auxiliary structures respectively form a part of the respective floating gate and an upper section of the auxiliary structures above the respective lower section is respectively removed and a second part of the respective floating gate is respectively formed prior to at least partially uncovering the liner.

9. The method of claim 8, comprising removing the upper sections of the liner.

10. The method of claim 8, wherein the second isolation structure initially extends above the mesa regions, and wherein pulling back the second isolation structure comprises pulling back the second isolation structure at most as far as a top side of the mesa regions.

11. The method of claim 8, comprising pulling back the second isolation structure as far as below a top side of the mesa regions.

12. The method of claim 8, comprising wherein the first isolation structure fills a lower region of the trenches.

13. The method of claim 8, comprising pulling back the first isolation structure in a bottom region of the trenches.

14. The method of claim 8, comprising selecting a material of the liner from a group consisting of silicon nitride, polysilicon and hafnium oxide.

* * * * *